(12) United States Patent
Sun et al.

(10) Patent No.: US 7,266,464 B2
(45) Date of Patent: Sep. 4, 2007

(54) DYNAMIC CUT-OFF FREQUENCY VARYING FILTER

(75) Inventors: Hongqiao Sun, Sugar Land, TX (US); Vesna R. Mirkovic, Pearland, TX (US); W. Spencer Wheat, Missouri City, TX (US)

(73) Assignee: Texaco Inc., San Ramon, CA (US)

( * ) Notice: Subject to any disclaimer, the term of this patent is extended or adjusted under 35 U.S.C. 154(b) by 0 days.

(21) Appl. No.: 11/016,278

(22) Filed: Dec. 17, 2004

(65) Prior Publication Data

US 2006/0136157 A1    Jun. 22, 2006

(51) Int. Cl.
*G01R 31/00* (2006.01)
(52) U.S. Cl. ...................................... 702/75
(58) Field of Classification Search .................. 702/57, 702/65, 69, 74, 75, 104, 189, 190, 191, 119, 702/130, 138, 187; 324/76.4, 76.55
See application file for complete search history.

(56) References Cited

U.S. PATENT DOCUMENTS

| | | | |
|---|---|---|---|
| 3,678,416 A * | 7/1972 | Burwen | ...................... 333/17.1 |
| 6,404,832 B2 | 6/2002 | Abe | |
| 6,507,799 B2 | 1/2003 | Steffen | |
| 6,741,919 B1 * | 5/2004 | Schuster et al. | ............... 701/34 |
| 6,757,910 B1 | 6/2004 | Bianu | |
| 6,760,362 B2 | 7/2004 | Patel et al. | |
| 6,816,006 B2 | 11/2004 | Ravatin et al. | |
| 6,888,422 B2 | 5/2005 | Brown et al. | |
| 6,894,580 B2 | 5/2005 | Horng et al. | |
| 2002/0120937 A1 | 8/2002 | Chang | |
| 2002/0196076 A1 | 12/2002 | Saiki | |
| 2003/0045263 A1 | 3/2003 | Wakayama et al. | |

* cited by examiner

*Primary Examiner*—Bryan Bui
(74) *Attorney, Agent, or Firm*—Williams, Morgan & Amerson, PC; Frank C Turner; Melissa Patangia

(57) ABSTRACT

A method and apparatus are disclosed. The apparatus includes a store of at least one historical sensor measurement, a store of potential cut-off frequencies, and a filter. Each potential cut-off frequency is associated with a respective potential difference between a sensor measurement and the stored historical sensor measurement. The filter has a cut-off frequency dynamically selected from the stored potential cut-off frequencies on the basis of a difference between the stored historical sensor measurement and a current sensor measurement. The method includes determining a difference between a current sensor measurement and a historical sensor measurement; and dynamically selecting a cut-off frequency for a filter for the current sensor measurement from the difference.

35 Claims, 7 Drawing Sheets

DYNAMIC CUT-OFF FREQUENCY VARYING FILTER

BACKGROUND OF THE INVENTION

1. Field of the Invention

The present invention pertains to process control, and, more particularly, to signal quality in a process control system.

2. Description of the Related Art

One common process control technique is to sense some characteristic or parameter of the process and adjust an input signal to alter the process parameter. For instance, a process might be designed such that a particular process operation is performed at a specific temperature. When the process operation begins, the temperature control is set to the desired temperature. However, it is not uncommon for the actual temperature to vary from the desired temperature during the process operation and for such variation to have undesirable consequences. The actual temperature is therefore monitored so that, if it deviates from the desired temperature, the input signal can be modified to bring the actual temperature to the desired temperature. Note that this technique is used not only for temperature, but also for other types of parameters, such as pressure, flow rate, and volume.

In practice, the parameter is measured, or sensed, by a suitable type of sensor. The sensor typically outputs an electrical signal that is representative of the sensed parameter. A control system can then sample this signal at predetermined intervals and extrapolate the sensed parameter from the pertinent characteristic of the sample. For instance, in the temperature scenario introduced above, the temperature sensor might output an electrical signal whose voltage (or current) is proportional to the temperature is sensed. Every 0.05 seconds, a control system might sample that electrical signal. The control system then determines from the voltage of that signal in that sample what the actual temperature was at the time it was sensed.

This control technique relies on the accuracy of the information conveying the actual, or measured, parameter. One problem in this respect is electrical "noise" in the signal the control system samples. The electrical noise alters the signal characteristics. If the noise is severe enough, the control system cannot accurately determine what the sensed parameter is, thereby leading to degraded process control. Electrical noise arises from many sources and is largely unavoidable. However, it can be mitigated.

There are many ways to reduce or mitigate electrical noise. One technique filters out unwanted frequencies in the sampled signal on the presumption that they are noise. More particularly, a low pass filter with a fixed cut-off frequency can be used to eliminate noise when the noise frequency spectrum is beyond the specified cut-off frequency. However, the noise signal could have a wide and dynamic frequency spectrum and sometimes it is very time consuming to figure out the noise spectrum range in a certain process. The noise spectrum could also be different in the same process if the data acquisition system is located in a different place. If the filter has a very low cut-off frequency, it could eliminate the majority part of the noise, however, it could also slow down the sensor response time in the data acquisition system significantly.

The present invention is directed to resolving, or at least reducing, one or all of the problems mentioned above.

SUMMARY OF THE INVENTION

The present invention, in its various aspects and embodiments, includes a method and apparatus. The apparatus comprises a store of at least one historical sensor measurement, a store of potential cut-off frequencies, and a filter. Each potential cut-off frequency is associated with a respective potential difference between a sensor measurement and the stored historical sensor measurement. The filter has a cut-off frequency dynamically selected from the stored potential cut-off frequencies on the basis of a difference between the stored historical sensor measurement and a current sensor measurement. The method comprises determining a difference between a current sensor measurement and a historical sensor measurement; and dynamically selecting a cut-off frequency for a filter for the current sensor measurement from the difference.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, the drawings illustrate specific embodiments herein described in detail by way of example. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Figure 1:
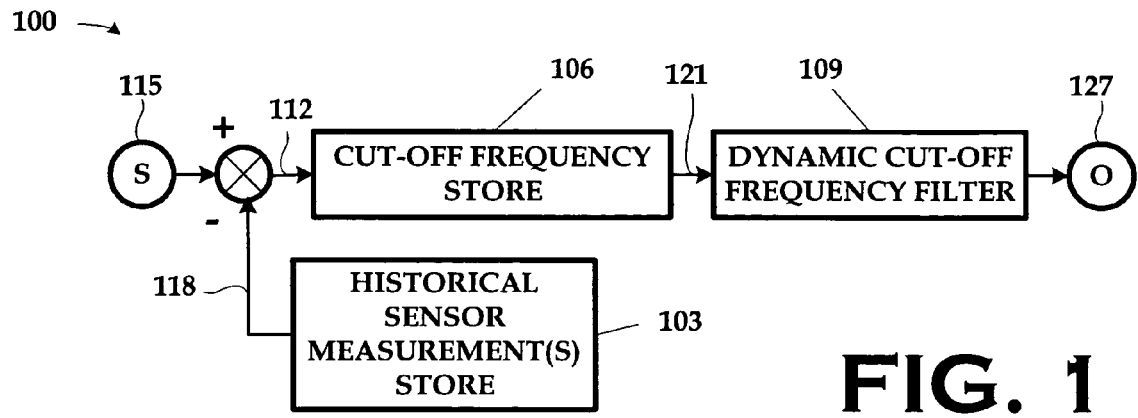
FIG. 1 is a block diagram of a filtering technique in accordance with the present invention.

FIG. 1 is a block diagram of an apparatus implementing a filtering technique in accordance with the present invention. A filter 100 comprises a store 103 of at least one historical sensor measurement; a store 106 of potential cut-off frequencies, and a filter 109 having a dynamic cut-off frequency. The filter 109 may be a low pass filter, a high pass filter, or a band pass filter, depending on the implementation. Each potential cut-off frequency in the store 106 is associated with a respective potential difference 112 between a sensor measurement 115 and the stored historical sensor measurement 118. The filter 109 has a cut-off frequency 121 dynamically selected from the stored potential cut-off frequencies 106 on the basis of a difference 112 between the stored historical sensor measurement 118 and the current sensor measurement 115.

Figure 2:
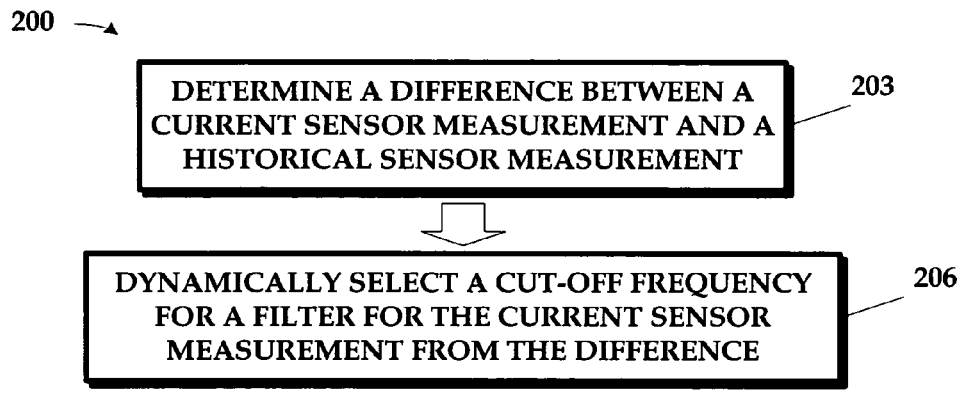
FIG. 2 illustrates a method of filtering a sensor measurement in accordance with the present invention.

FIG. 2 illustrates a method 200 of filtering a sensor measurement, e.g., the current sensor measurement 115, in accordance with the present invention with, e.g., the apparatus 100 in FIG. 1. The method 200 begins by determining (at 203) a difference 112 between a current sensor measurement 115 and a historical sensor measurement 118 and then dynamically selects (at 206) a cut-off frequency 121 for a filter 109 for the current sensor measurement 115 from the difference 112. The application of the method 200 in FIG. 2 is the filtered sensor measurement 127 in FIG. 1.

Figure 3A:
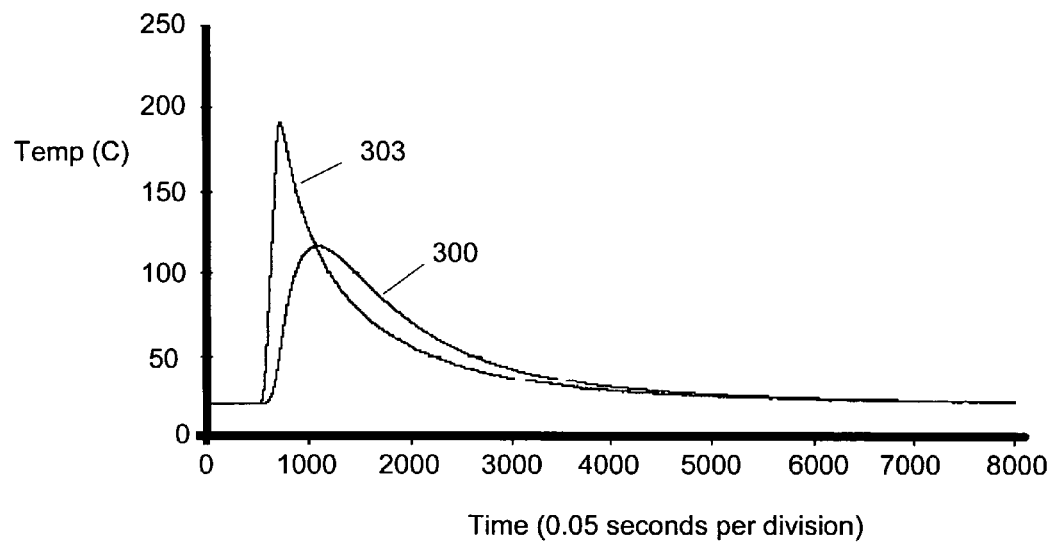
FIG. 3A-FIG. 3E compare the performance of a method and apparatus performed in accordance with the present invention to a conventional filtering technique wherein the filter comprises a low pass filter.
Figure 3B:
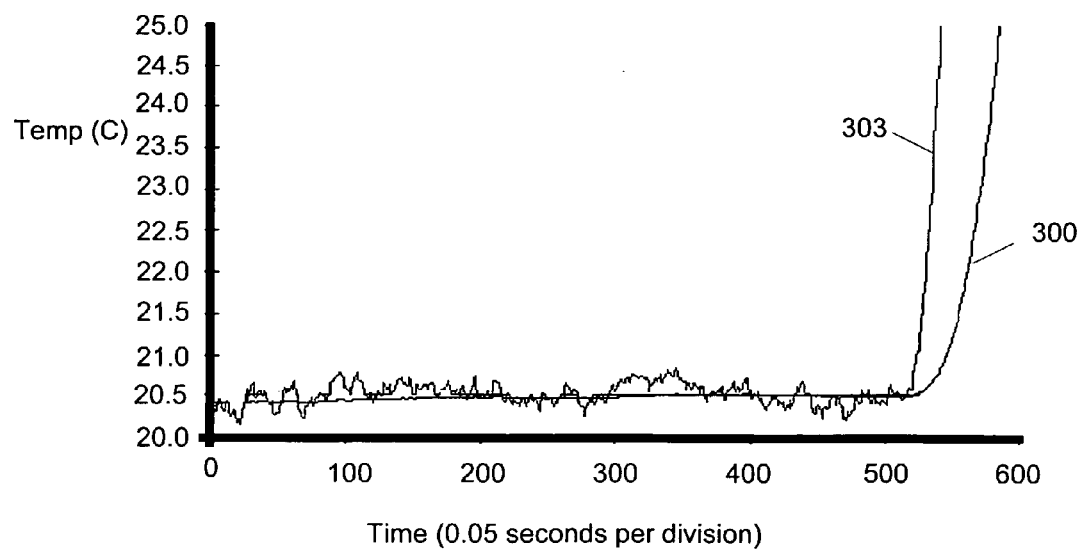
Figure 3C:
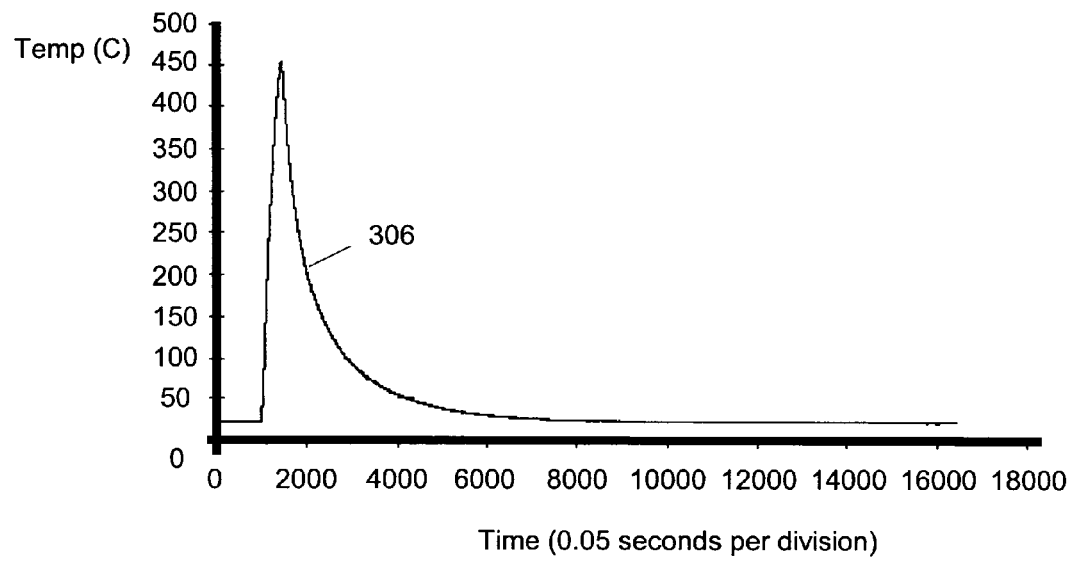
Figure 3D:
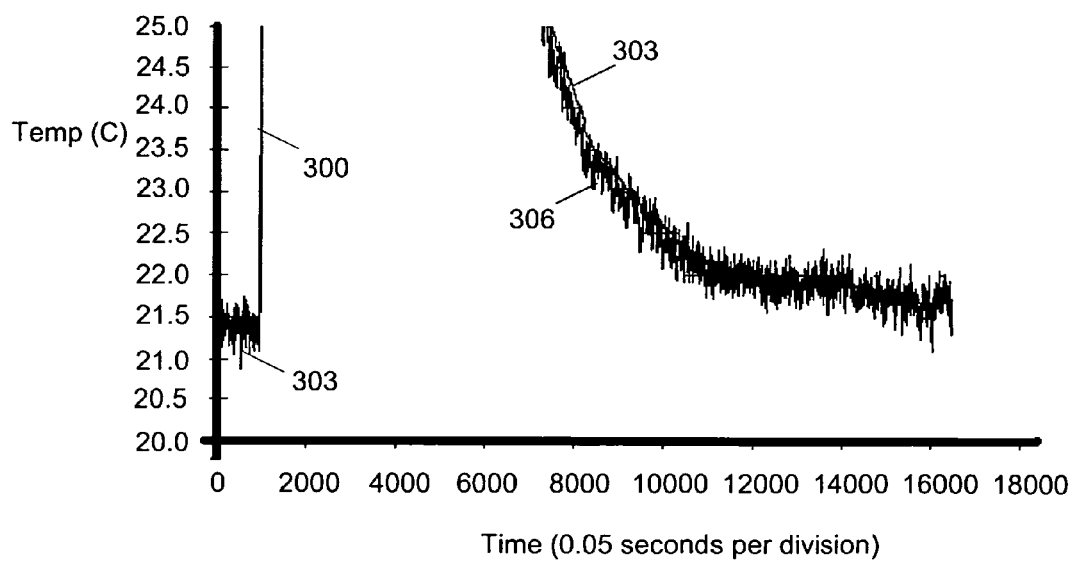
Figure 3E:
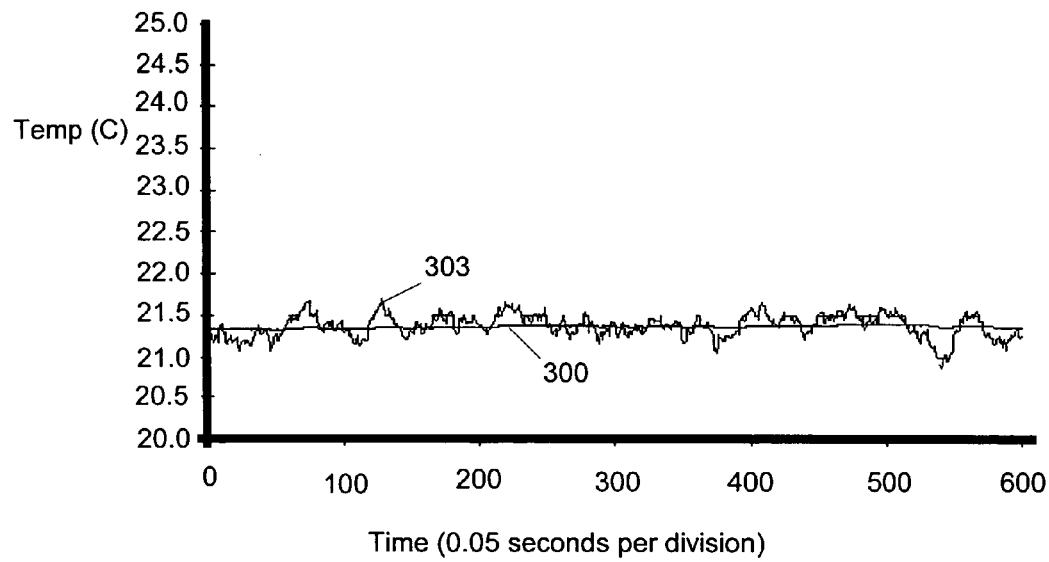

Thus, the present invention provides a general purpose filter 100 with a dynamic response to reduce the noise in the data acquisition and control system (not shown) through which, e.g., the current sensor measurement 115 may be conditioned. FIG. 3A-FIG. 3E compare the performance of the present invention in one particular embodiment with a conventional filtering technique. More particularly, for an embodiment in which the filter 109 is a low pass filter:

FIG. 3A compares the performance in the presence of rapid change in the sensor measurement;

FIG. 3B compares the performance during steady-state conditions for the process parameter;

FIG. 3C compares a response to a rapid process change, and shows an equally fast response and an equally good steady-state response as the conventional filter;

FIG. 3D compares the dynamic frequency varying response in a scaled view; and FIG. 3E compares the dynamic frequency varying steady-state response in a scaled view.

In each drawing, the response of the cut-off frequency varying filter is represented by the trace 300 and the response of the conventional filter is represented by the trace 303. The sole exception is in FIG. 3C, in which the traces 300 and 303 overlay each to generate the composite trace 306.

As FIG. 3A-FIG. 3E show, the dynamic cut-off frequency varying filtering technique demonstrates better response either in rapid process variable change or in the steady-state. More particularly, the filtering technique of the present invention exhibits the same steady state response as a low cut-off frequency filter and same quick response nature as a base filter. Thus, the dynamic cut-off frequency varying low pass filter shifts its cut-off frequency dynamically in order to eliminate the noise while maintaining a quicker response.

Figure 4:
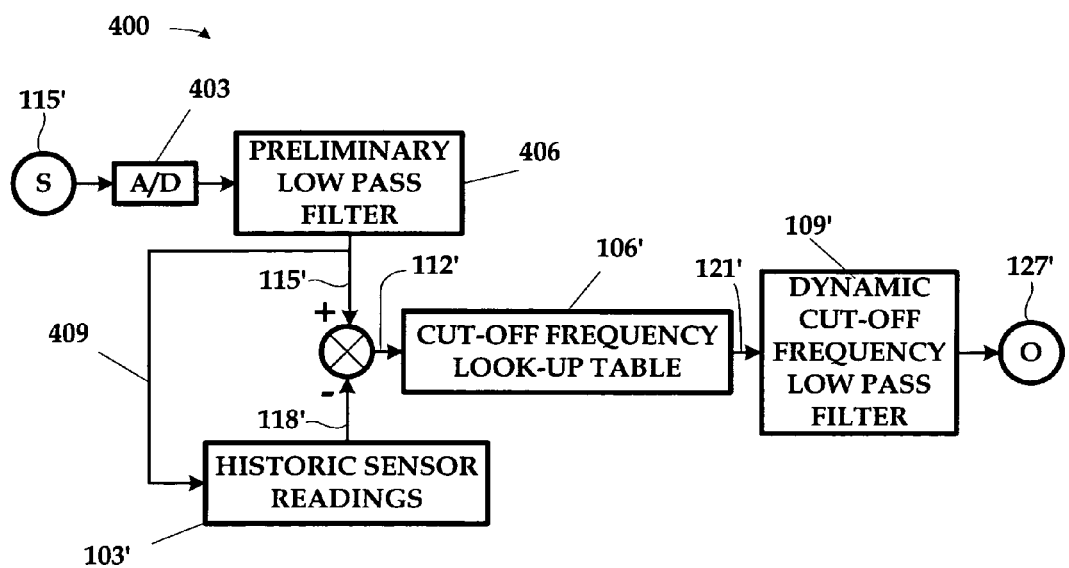
FIG. 4 illustrates one particular embodiment of the filtering technique first shown in FIG. 1.

To further an understanding of the present invention, additional discussion regarding one particular embodiment of the present invention will now be presented. FIG. 4 illustrates one particular filter 400. The filter 400 is one particular embodiment of the filter 100 in FIG. 1, with like parts bearing like numbers. In general, the current sensor measurement 115' is sampled into the data acquisition system every 50 milliseconds and converted to a digital format by the analog-to-digital ("A/D") converter 403.

A preliminary low-pass filter 406 with a fast response characteristic preliminarily filters the current sensor measurement 115'. The preliminary low-pass filter 406 employs a constant cut-off frequency to preliminarily filter certain frequencies that will be known to be noise in the particular implementation. The preliminary low-pass filter 406 is optional from the standpoint of the invention since, in some embodiments, the sensors (not shown) through which the measurements are taken may be of sufficient quality that they produce minimally low levels of noise. Similarly, the context in which the invention is employed may be such that environmental factors might not introduce significant levels of noise. However, in general, a preliminary low-pass filter 406 will be desirable in most applications.

A few historic sampling points in the store 103' are compared with the current sensor measurement 115' to determine the rate of change of this particular process variable represented by the current sensor measurement 115'. More particularly, as will be discussed further below, the historical sensor measurement 118' is actually an average of four past sensor measurements 115'. Each filtered sample of the sensor measurement 115', is returned to the historical sensor measurement store 103' through a feedback 409 to populate the store 103'. The cut-off frequency store 106' containing the rate of changes versus cut-off frequencies is used to set the cut-off frequency 121' of the low pass filter 109'.

In this particular embodiment, the decision making process of the cut-off frequency is updated during each sampling period to avoid filtering out the true sensor signal. More particularly, as those in the art having the benefit of this disclosure will appreciate, the filtering technique is applied over time through multiple iterations as the current sensor measurement 115' is sampled. In each iteration, the historical sensor measurement 118' is an average of four past sensor measurement 115'. Periodically, a sensor measurement 115' for the current iteration is transmitted to the store to take the place of the sensor measurement 115', which is then purged. In this way, when the process parameter represented by the current sensor measurement 115' is in a steady state, high frequency signals, which are apparently the noises, are filtered out. When the process parameter is in a dynamic change state, the cut-off frequency 121' is shifted up to avoid filtering out the true signal.

Note that, in the embodiment of FIG. 4, the cut-off frequency 121' is a piecewise linear function of the difference 112'. In the illustrated embodiment, if the difference (d) is $3\% \leq d \leq 10\%$ (full scale), then the cutoff frequency is set to 0.01-0.2 (normalized, Z-domain). In such an embodiment, the precise parameters of the relationship will be a function of implementation specific considerations, such as the type of process being monitored and how rapidly it is expected to change. In the illustrated embodiment, which the monitored process is a water-gas shift reaction in an autothermal reformer, which is not expected to change rapidly during normal or steady state operations. Some alternative embodiments might even choose to use some other type of relationship.

Figure 5:
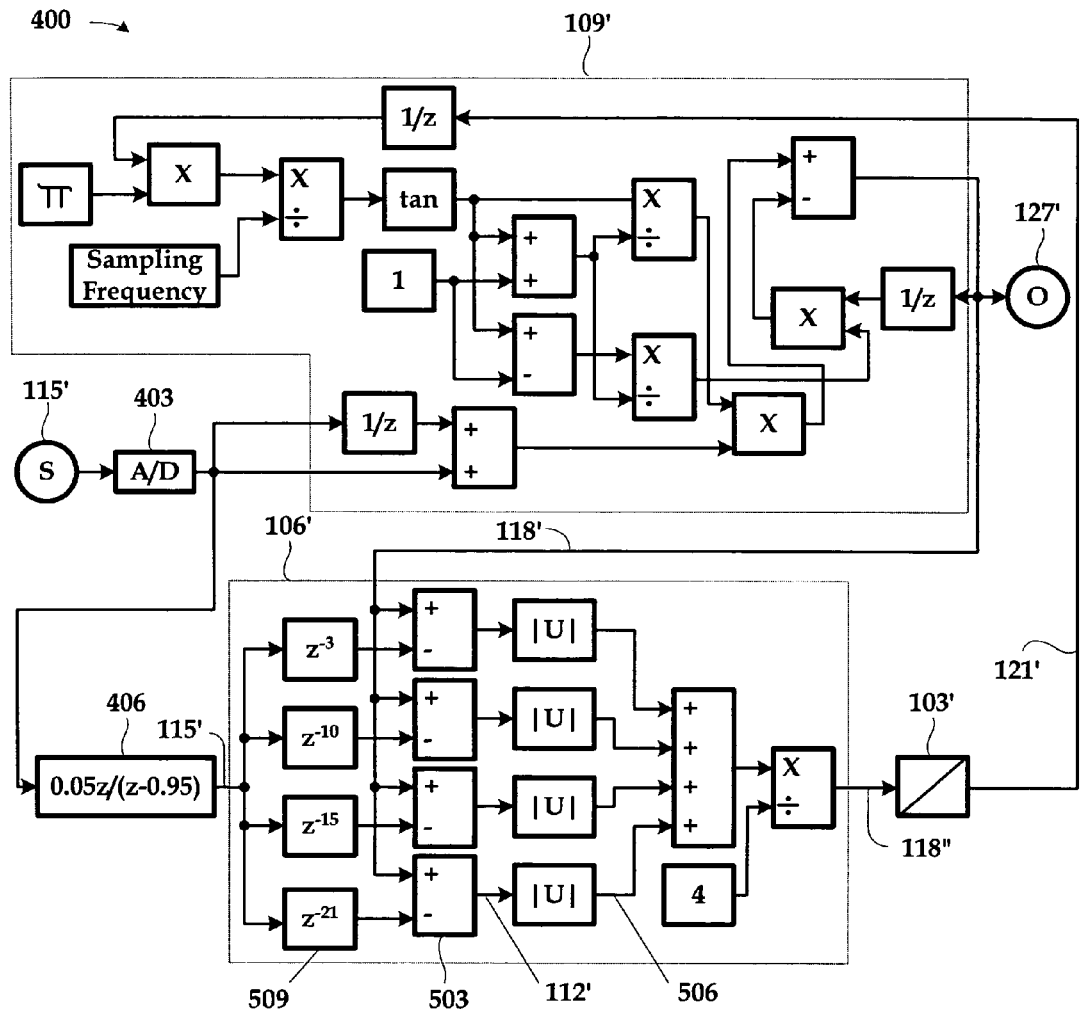
FIG. 5 is a functional block diagram of the embodiment of FIG. 4.

FIG. 5 illustrates the functional components of the filter 400 in FIG. 4. More particularly, FIG. 5 illustrates in a block diagram the transfer function 500 of the $1^{st}$ order filter 400 in FIG. 4 in the z-domain. Note that, in this embodiment, there are four flip-flops 503. Each stores the difference between a respective historical sensor measurements 118' (only one indicated) and the current sensor measurement 115'. The absolute values 506 (only one indicated) of the differences 112' (only one indicated) are then averaged and the averaged historical sensor measurement 118″ is used to obtain the cut-off frequency 121′ from the cut-off frequency look-up table 106′. Note also that the delays 509 (only one indicated) for the flip-flops 503 differ, and that, collectively, they store the four historical sensor measurements 118′.

Still referring to FIG. 5, because the filter 400 is taking readings so fast, the historical sensor measurements 115′ in the store 103′ should not be too close to the current sensor measurement 115′. The delays 509 are shown in the form of $Z^{-x}$, where x is the number of readings preceding the current reading. Thus, $Z^{-3}$ indicates the third sensor measurement 115′ preceding the current sensor measurement 115′, $Z^{-10}$ indicates the tenth sensor measurement 115′ preceding the current sensor measurement 115′, etc. The value of x is arbitrary but should be large enough so that the historical sensor measurement 115′ is not too close to the current sensor measurement 115′.

Returning to FIG. 1, as those in the art having the benefit of this disclosure will appreciate, the filter 100 may be implemented in software, in hardware, or both. Thus, either or both of the cut-off frequency store 106 and the historical sensor reading(s) store 103 may be implemented in software as, for example, a data store such as a table, a list, a queue, or a database. In the filter 400 of FIG. 4, the cut-off frequency store 106′ is implemented in software as a look-up table. Or they may be implemented in hardware, e.g., stored in a memory device such as an erasable, electrically programmable memory ("EEPROM"), or a random access memory ("RAM") of some kind. In the filter 400 of FIG. 4, the historical sensor readings are stored in a plurality of memory devices, i.e., the flip-flops 503 shown in FIG. 5.

Figure 6A:
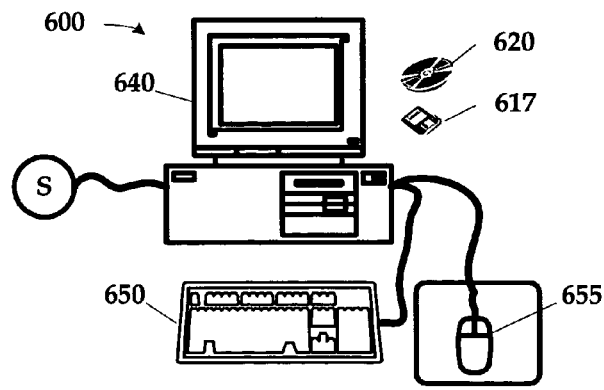
FIG. 6A and FIG. 6B conceptually illustrate a computing apparatus as may be used in the implementation of one particular embodiment of the present invention.
Figure 6B:
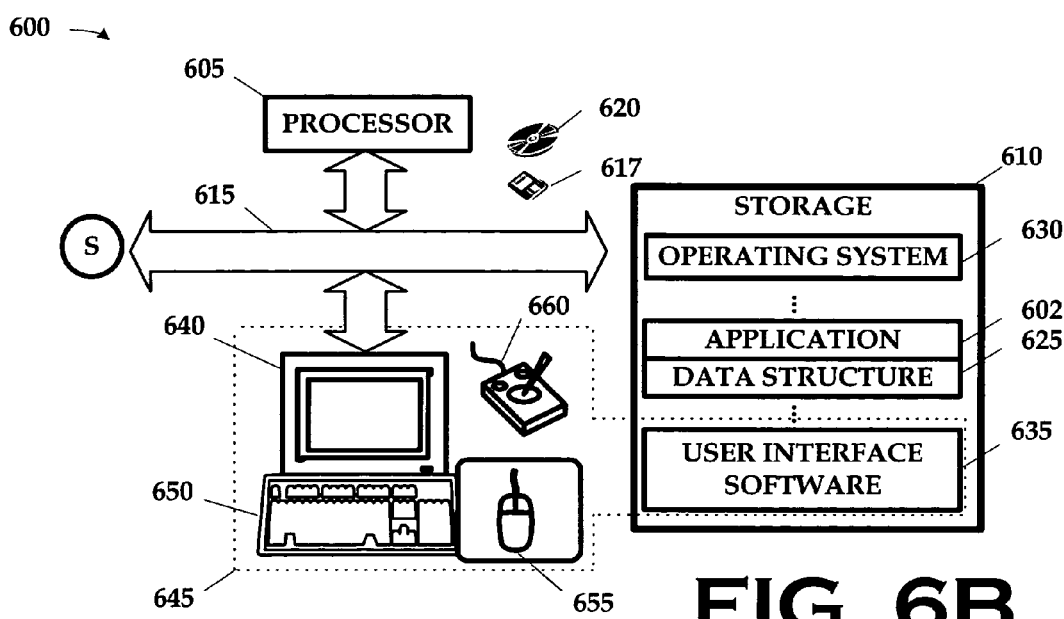

Thus, at least significant portions of the method 200, shown in FIG. 2, may be computer-implemented on, e.g., a computing apparatus 600, illustrated in FIG. 6A and FIG. 6B, in the form of an application 602, written using, e.g., SIMULINK, from Matlab. Although the illustrated embodiment is rack-mounted, the computing apparatus 600 need not be rack-mounted in all embodiments. Indeed, this aspect of any given implementation is not material to the practice of the invention. The computing apparatus 600 may be implemented as a desktop personal computer, a workstation, a notebook or laptop computer, an embedded processor, or the like.

The computing apparatus 600 illustrated in FIG. 6A and FIG. 6B includes a processor 605 communicating with storage 610 over a bus system 615. The storage 610 may include a hard disk and/or random access memory ("RAM") and/or removable storage such as a floppy magnetic disk 617 and an optical disk 620. The storage 610 is encoded with a data structure 625 storing the data set acquired as discussed above, an operating system 630, user interface software 635, and an application 602. The user interface software 635, in conjunction with a display 640, implements a user interface 645. The user interface 645 may include peripheral I/O devices such as a key pad or keyboard 650, a mouse 655, or a joystick 660. The processor 605 runs under the control of the operating system 630, which may be practically any operating system known to the art. The application 602 is invoked by the operating system 630 upon power up, reset, or both, depending on the implementation of the operating system 630. In the illustrated embodiment, the application 602 includes the filtering technique illustrated in FIG. 1.

Thus, at least some aspects of the present invention will typically be implemented as software on an appropriately programmed computing device, e.g., the computing apparatus 600 in FIG. 6A and FIG. 6B. The instructions may be encoded on, for example, the storage 610, the floppy disk 617, and/or the optical disk 620. The present invention therefore includes, in one aspect, a computing apparatus programmed to perform the method of the invention. In another aspect, the invention includes a program storage device encoded with instructions that, when executed by a computing apparatus, perform the method of the invention.

Some portions of the detailed descriptions herein are consequently presented in terms of a software implemented process involving symbolic representations of operations on data bits within a memory in a computing system or a computing device. These descriptions and representations are the means used by those in the art to most effectively convey the substance of their work to others skilled in the art. The process and operation require physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated or otherwise as may be apparent, throughout the present disclosure, these descriptions refer to the action and processes of an electronic device, that manipulates and transforms data represented as physical (electronic, magnetic, or optical) quantities within some electronic device's storage into other data similarly represented as physical quantities within the storage, or in transmission or display devices. Exemplary of the terms denoting such a description are, without limitation, the terms "processing," "computing," "calculating," "determining," "displaying," and the like.

Note also that the software implemented aspects of the invention are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The invention is not limited by these aspects of any given implementation.

Figure 7:
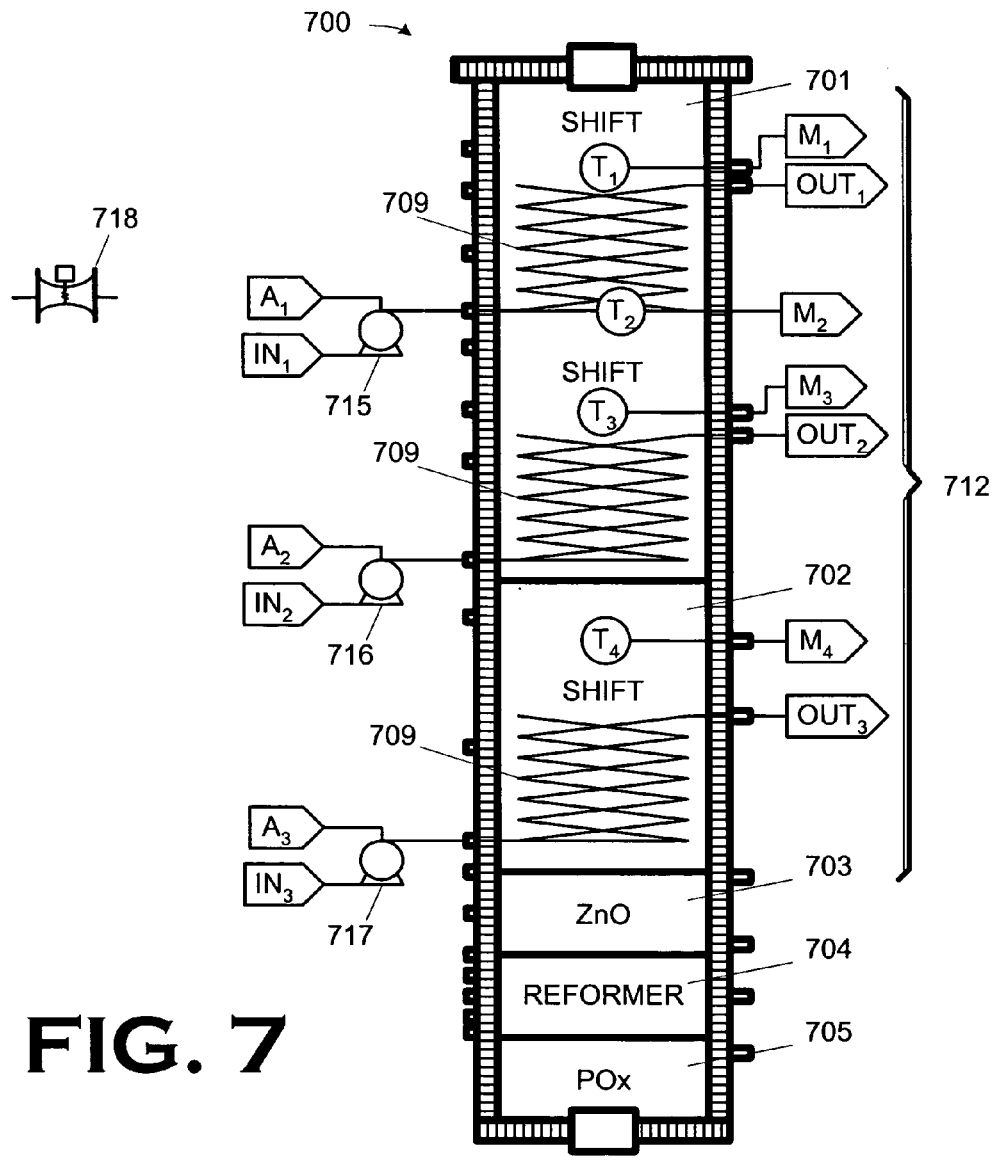
FIG. 7 and FIG. 8 conceptually illustrate one particular context in which the present invention may be employed.

The present invention will find application in a wide variety of contexts. Consider the context illustrated in FIG. 7-FIG. 8. FIG. 7 conceptually depicts one particular implementation of an autothermal reformer ("ATR") 700, which is employed as an integral part of a fuel processor. A fuel processor converts, or processes, one type of fuel into another. The ATR 700 is employed in a fuel processor that processes a hydrocarbon fuel (e.g., natural gas) into hydrogen ($H_2$). The ATR 700 comprises several stages 701-705, including several heat exchangers 709 and electric heaters (not shown). The reformer shift bed 712, i.e., the sections 701-702, performs a water-gas shift reaction that reduces CO concentration and increases $H_2$ production rate. The ATR 700 may be implemented with any suitable design known to the art. The reaction temperature within the shift bed 712 is a factor in the water gas shift reaction and the composition of the reformate produced.

Each of the heat exchangers 709 receives temperature controlled coolant (not shown) over the lines $IN_1$-$IN_3$, respectively, and returns it over the lines $OUT_1$-$OUT_3$, respectively. The flow rate for the coolant in each line is controlled by a respective variable speed (i.e., positive displacement) pump 715-717. The pumps 715-717 are controlled by an automated control system (not shown) by signals received over the lines $A_1$-$A_3$, respectively. In alternative embodiments, a single pump may supply coolant under pressure over the lines $IN_1$-$IN_3$ and the flow rate may be controlled by flow control valves such as the flow control valve 718. The reaction temperature(s) within the shift bed sections of ATR 700 can be controlled by controlling the flow(s) of coolant through heat exchangers 709. Note that FIG. 7 is simplified by the omission of some elements. For example, the heat exchangers mentioned above and various inputs and outputs to the sections 703-705 have been omitted for the sake of clarity and so as not to obscure the present invention.

The shift bed 712 also includes a plurality of sensors $T_1$-$T_4$ disposed therein for sensing the reaction temperature(s). The precise number of temperature sensors $T_x$ is not material although a greater number will typically enable a finer degree of control. In the illustrated embodiment, the temperature sensors $T_1$-$T_4$ are thermocouples, but other types of temperature sensor may be used in alternative embodiments. The temperature sensors $T_1$-$T_4$ monitor actual temperatures at various locations within the shift bed 712. Temperature detection points are selected based upon the structure of the cooling/heating system and should be selected so that the measured temperatures reflect true reaction temperatures rather than localized temperatures adjacent the heat exchange coils 709.

Note that the temperature sensors $T_1$ and $T_2$ both measure temperature near the same heat exchanger 709 in a detail that is implementation specific. That particular heat exchanger 709 includes only a single coolant input $IN_1$. Most of the temperature sensors $T_1$-$T_4$ measure temperature downstream from a catalyst bed section containing a heat exchanger 709. $T_1$ is supposed to read the temperature immediately downstream from the uppermost catalyst bed (not shown). However, during installation and shipping the shift bed 712 can shift and settle so that $T_1$ is measuring an air temperature rather than a bed or reaction temperature. Thus, a second sensor $T_2$ is added to monitor the upper section 701 of the ATR 700. When $T_1$ and $T_2$ are sensing different temperatures, the control system (not shown) takes the higher of the two temperatures. Typically, there usually is only a minor difference between the two temperatures.

Each of the temperature sensors $T_1$-$T_4$ outputs a respective signal $M_1$-$M_4$ representative of the sensed, or measured, temperature. The temperature sensors $T_1$-$T_4$ operate in parallel, and so the signals $M_1$-$M_4$ are output in parallel. Each of the signals $M_1$-$M_4$ is conditioned by a respective filter 400, shown in FIG. 4. This particular embodiment therefore employs four filters 400 in parallel. Note, however, that multiple signals $M_x$ may be multiplexed and conditioned serially by a single filter 400 in alternative embodiments.

Preheating and water cooling maintain the reaction temperature in the shift bed 712 within a desired reaction temperature range. In order to achieve this objective in an enlarged shift reactor, multiple heat exchange coils 709 provide localized temperature control. In the illustrated embodiment, the elongated shift bed 712 utilizes three different heat exchange coils 709 for controlling the temperature of the shift bed 712. The flow of coolant through each of coils 709 can be manually set and adjusted in response to the filtered temperature sensor measurements. In an alternative, the filtered temperature sensor measurements can be relayed or communicated to a control system having a control loop capable of automatically adjusting the flows of coolant in coils 709 in response to the filtered sensor measurements. One such control loop may include a reaction temperature control strategy that varies as a combination result of $H_2$ production rate, shift reaction stage, shift bed vertical temperature gradient and the temperature detecting points in a manner described more fully below.

Figure 8:
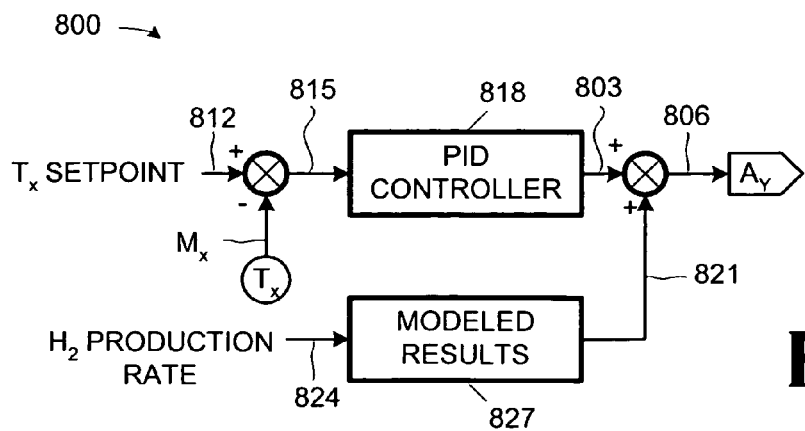

FIG. 8 conceptually illustrates a control loop 800 employed by the illustrated embodiment in accordance with the present invention. The settings for each of the variable speed pumps 715-717 is controlled by a respective control loop 800. The control technique of the present invention employs, in the illustrated embodiment, the complete system modeling effect (the reformer as a whole, including ATR section, ZnO section, shift section, production rate, etc.), develops a dynamic PID control loop to the plant response, and testing data are used to compensate the model offset to improve the robustness of the controller.

More particularly, system modeling takes into account the target hydrogen production rate based upon current flow rates, upstream temperature profiles, reaction stage and shift bed temperature gradient due to heat loss and exothermal reaction effect. A system model for each section of the shift bed can be generated from reactions and conditions that occur upstream, the geometries of the reactor(s), the feed to the section of the bed, the shift catalyst used, etc. Various modeling techniques of this type are known to the art, and any suitable modeling technique may be employed. The system modeling is used to generate set points to be used for the temperature control. These set points include the predicted reformate composition, flow rate and temperature that will be entering a particular shift bed section. Thus, the system modeling generates a group of setpoints for the temperatures measured by the temperature sensors $T_1$-$T_4$. The system modeling also produces a set of results correlating, for example, the temperatures that may be measured by the temperature sensors $T_1$-$T_4$ and the $H_2$ production rate of the ATR 700.

More particularly, the model (not shown) used by the illustrated embodiment was developed using Aspen Plus and Aspen Custom Modeler. These software packages are commercially available from:

Aspen Technology, Inc.

Ten Canal Park

Cambridge, Mass. 02141-2201

USA

Phone: +1-617-949-1000

Fax: +1-617-949-1030 email: info@aspentech.com

However, other suitable modeling software known to the art may be employed in alternative embodiments.

The model has both steady-state and dynamic capabilities. The performance of the ATR 700 is estimated by the model from thermodynamic parameters that result in a desired state at the given temperature and pressure. Reaction conversions and compositions are determined from either kinetic data available in literature for such typical reactions or estimated from models based on experiments conducted in the laboratory for specific reactions. The desired $H_2$ purity and flow rate for the reformate are specified and the model calculates natural gas flow, air flow (calculated back from the optimum $O_2/C$ ratio), and water flow (calculated back from the optimum Steam/Carbon ratio).

The resulting temperature of the ATR 700 is calculated as the adiabatic temperature rise resulting from minimizing the free energy of the ATR reaction. The composition of reformate is determined by the model (from thermodynamic and reaction parameter estimations). Using this composition, the model then calculates the desired speed needed for the end use from empirical correlations.

The control loop 800 shown in FIG. 8 controls the reaction temperature of the fuel processor, i.e., the temperature in the shift bed 712, shown in FIG. 7, where employed. Multiple control loops 800 can be employed in serial or in parallel to control the temperature in a plurality of locations throughout the shift bed 712 or elsewhere in the ATR 700. A first component 803 for a setting adjustment 806 for an actuator governing a measured temperature 809 in a reaction section of a reactor is determined from the measured temperature 809 and a setpoint 812 for the measured temperature. The setpoint 812 is determined as a part of the modeled results discussed above. The measured temperature 809 is the temperature measured by the temperature sensor $T_x$ at the point of interest in the shift bed 712, shown in FIG. 7, at which the temperature sensor $T_x$ is disposed. In the illustrated embodiment, the difference 815 between the setpoint 812 and the measured temperature 809 is input to a proportional-integral-derivative ("PID") controller 818, such as is known in the art. The output of the PID controller 818 is the first component 803.

A second component 821 for the setting adjustment 806 is then determined from a $H_2$ production rate 824 for ATR 700. In the illustrated embodiment, at least selected portions of the modeled results previously discussed are tabulated in a form indexable by the $H_2$ production rate. Thus, the modeled results 827 may be, for instance, a look-up table wherein various setting adjustments for the actuator are indexed by the $H_2$ production rate to which they correlate. Note that the modeled results 827 are typically generate a priori by modeling the operation of ATR 700 in a variety of operating scenarios to obtain this information. Note also that the determination of the first and second components 803, 821 may be performed in parallel or in serial.

The setting adjustment 806 is then determined from the first and second components 803, 821. In the illustrated embodiment, the first and second components 803, 821 are summed to obtain the setting adjustment 806, although alternative embodiments may use more sophisticated techniques for the determination. The setting adjustment 806 is then signaled to the actuator over the line $A_y$. Note that the setting adjustment 806 may be 0, i.e., no change is needed because the measured temperature 809 suitable matches the setpoint 812. However, at any given time, at least one of, and sometimes all of, the first component 803, the second component 821, and the setting adjustment 806 will be non-zero.

Note that, in some circumstances, the first and second components 803, 821 could work in opposite directions with one telling a pump to increase flow and the other telling the pump to decrease flow. Thus, in the illustrated embodiment, the two components 803, 821 are not given equal weight in controlling the coolant flow. Specifically, the $H_2$ production rate and the information from the look up table, i.e., the second component 821, is the dominant component. The first component 803 that is derived from sensed temperatures 809 and the setpoints 812, is used to fine tune the pump speed. By way of example, the second component 821 might instruct a given pump to operate at 80% of capacity, while the first component focuses on the error and may adjust the pump speed by ±5% of capacity.

Thus, the temperature in the shift bed 712 can be controlled more accurately than in conventional approaches. As is shown in FIG. 3A-FIG. 3E, the dynamic cut-off frequency varying filtering technique demonstrates better response either in rapid process variable change or in the steady-state. In addition to providing a better conditioned signal to the control loop 800, shown in FIG. 8, the quicker response helps reduce delay therein. Note also that the filtering technique of the present invention can be used to control other aspects of the operation of the ATR 700, such as pressures, flow rates, sensed compositional data etc., and in contexts other than autothermal reforming and fuel processing generally.

This concludes the detailed description. The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An apparatus, comprising:
   a sensing input device;
   a current sensor measurement;
   a store of at least one historical sensor measurement;
   a store of potential cut-off frequencies, each potential cut-off frequency being associated with a respective potential difference between the current sensor measurement and the stored historical sensor measurement; and
   a filter having a cut-off frequency dynamically selected from the stored potential cut off frequencies on the basis of a difference between the stored historical sensor measurement and the current sensor measurement.

2. The apparatus of claim 1, wherein the filter comprises a low pass filter.

3. The apparatus of claim 1, wherein the filter comprises a high pass filter.

4. The apparatus of claim 1, wherein the filter comprises a band pass filter.

5. The apparatus of claim 1, further comprising a preliminary filter capable of filtering the current sensor measurement prior to taking the difference with the stored historical measurement.

6. The apparatus of claim 5, wherein the preliminary filter comprises a software-implemented filter.

7. The apparatus of claim 5, wherein the preliminary filter comprises a hardware implemented filter.

8. The apparatus of claim 7, wherein the hardware-implemented filter comprises a resistor-capacitor circuit.

9. The apparatus of claim 1, wherein at least one of the store of historical sensor measurements and the store of potential cut-off frequencies comprises a software implemented store or a hardware implemented store.

10. The apparatus of claim 1, wherein the store of historical sensor measurements comprises a hardware-implemented store.

11. The apparatus of claim 10, wherein the hardware-implemented store comprises a plurality of memory devices.

12. The apparatus of claim 1, wherein the store of potential cut-off frequencies comprises a software-implemented data structure.

13. The apparatus of claim 1, wherein the data structure comprises a table, a list, a queue, or a database.

14. The apparatus of claim 1, wherein the filter comprises a software-implemented filter.

15. The apparatus of claim 1, wherein the filter comprises a hardware-implemented filter.

16. The apparatus of claim 15, wherein the hardware-implemented filter comprises a resistor-capacitor circuit.

17. The apparatus of claim 1, wherein the current sensor measurement comprises one of a temperature measurement, a pressure measurement, a flow rate measurement and a compositional measurement.

18. The apparatus of claim 1, wherein potential cut-off frequency is a piecewise linear function of the potential difference.

19. The apparatus of claim 1, wherein the historical measurement comprises an average of a plurality of historical measurements.

20. A method, comprising:
 determining a current sensor measurement;
 determining a difference between the current sensor measurement and a historical sensor measurement;
 dynamically selecting a cut-off frequency for a filter for the current sensor measurement from the difference; and
 filtering the current sensor measurement using the dynamically selected cut-off frequency.

21. The method of claim 20, wherein dynamically selecting a cut-off frequency for the filter includes dynamically selecting the cut-off frequency for a low pass filter.

22. The method of claim 20, wherein dynamically selecting a cut-off frequency for the filter includes dynamically selecting the cut-off frequency for a high pass filter.

23. The method of claim 20, wherein dynamically selecting a cut-off frequency for the filter includes dynamically selecting the cut-off frequency for a band pass filter.

24. The method of claim 20, further comprising taking an average of a plurality of stored historical sensor measurements to obtain the historical sensor measurement.

25. The method of claim 20, further comprising filtering the current sensor measurement for noise prior to determining the difference.

26. The method of claim 20, further comprising storing the historical measurement.

27. The method of claim 26, wherein storing the historical measurement includes storing the historical measurement in a hardware implemented store.

28. The method of claim 27, wherein storing the historical measurement in the hardware implemented store includes storing the historical measurement in a hardware store comprising a plurality of memory devices.

29. The method of claim 26, wherein storing the historical measurement includes storing the historical measurement in a software implemented store.

30. The method of claim 29, wherein storing the historical measurement in the software implemented store includes storing the historical measurement in one of a table, a list, a queue, or a database.

31. The method of claim 20, further comprising sampling the current sensor measurement.

32. The method of claim 20, wherein dynamically selecting the cut-off frequency includes retrieving the cut-off frequency from a software implemented store.

33. The method of claim 32, wherein retrieving the cut-off frequency from the software implemented store includes retrieving the cut-off frequency from one of a table, a list, a queue, or a database.

34. The method of claim 20, wherein dynamically selecting the cut-off frequency includes applying a piecewise linear function.

35. The method of claim 20, wherein dynamically selecting the cut-off frequency includes retrieving the cut-off frequency from a hardware implemented store.

* * * * *